United States Patent
Juen

(10) Patent No.: US 10,375,339 B2
(45) Date of Patent: Aug. 6, 2019

(54) IMAGING DEVICE

(71) Applicant: NIKON CORPORATION, Tokyo (JP)

(72) Inventor: Masahiro Juen, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/654,338

(22) Filed: Jul. 19, 2017

(65) Prior Publication Data

US 2017/0318251 A1 Nov. 2, 2017

Related U.S. Application Data

(63) Continuation of application No. 14/936,035, filed on Nov. 9, 2015, now Pat. No. 9,743,028, which is a
(Continued)

(30) Foreign Application Priority Data

Aug. 24, 2010 (JP) .................................. 2010-186888

(51) Int. Cl.
*H04N 5/335* (2011.01)
*H04N 5/369* (2011.01)
(Continued)

(52) U.S. Cl.
CPC ....... *H04N 5/378* (2013.01); *H01L 27/14609* (2013.01); *H01L 27/14634* (2013.01);
(Continued)

(58) Field of Classification Search
CPC ......... H01L 27/14621; H01L 27/14625; H01L 27/1464; H01L 27/14641; H01L 27/14643;
(Continued)

(56) References Cited

U.S. PATENT DOCUMENTS 7,777,798 B2 8/2010 Mabuchi
2003/0043089 A1* 3/2003 Hanson .................. H04N 5/335
345/55
(Continued)

FOREIGN PATENT DOCUMENTS

CN 1783958 A 6/2006
CN 101257560 A 9/2008
(Continued)

OTHER PUBLICATIONS

Jan. 6, 2015 Office Action issued in Japanese Patent Application No. 2010-186888.
(Continued)

*Primary Examiner* — Jason A Flohre
(74) *Attorney, Agent, or Firm* — Oliff PLC

(57) ABSTRACT

An imaging device has a sensor chip and a signal processing chip. The sensor chip includes a pixel array in which a plurality of pixels are arranged in a 2-dimensional matrix and a data output terminal group made up of a plurality of data output terminals which output analog signals of pixels for each pixel column of the pixel array. The signal processing chip includes a data input terminal group electrically coupled to the data output terminal group, a plurality of A/D converters which convert analog signals of pixels received by the data input terminal group into digital signals for each pixel column of the pixel array, and a control unit which controls operation of the plurality of A/D converters.

22 Claims, 8 Drawing Sheets

Related U.S. Application Data continuation of application No. 13/813,515, filed as application No. PCT/JP2011/004576 on Aug. 12, 2011, now Pat. No. 9,210,337.

(51) Int. Cl.
*H04N 5/376* (2011.01)
*H04N 5/378* (2011.01)
*H01L 27/146* (2006.01)

(52) U.S. Cl.
CPC .. *H01L 27/14636* (2013.01); *H01L 27/14643* (2013.01); *H04N 5/335* (2013.01); *H04N 5/369* (2013.01); *H04N 5/3765* (2013.01); *H01L 27/14618* (2013.01); *H01L 2924/0002* (2013.01)

(58) Field of Classification Search
CPC ........... H04N 5/23229; H04N 5/35563; H04N 5/37213; H04N 5/378
USPC .......... 348/221.1, 222.1, 229, 294, 300, 396
See application file for complete search history.

(56) References Cited

U.S. PATENT DOCUMENTS

| | | | |
|---|---|---|---|
| 2004/0145666 A1 | 7/2004 | Murata et al. | |
| 2004/0165072 A1 | 8/2004 | Takaki et al. | |
| 2005/0280730 A1 | 12/2005 | Lim et al. | |
| 2007/0109436 A1* | 5/2007 | Mabuchi | H04N 3/155 348/308 |
| 2007/0241273 A1 | 10/2007 | Kim et al. | |
| 2008/0042046 A1* | 2/2008 | Mabuchi | H01L 27/14634 250/208.1 |
| 2008/0231491 A1 | 9/2008 | Muramatsu et al. | |
| 2008/0231738 A1 | 9/2008 | Iida | |
| 2009/0040352 A1* | 2/2009 | Kawaguchi | H04N 5/335 348/308 |
| 2009/0166774 A1* | 7/2009 | Takahira | H01L 27/14618 257/431 |
| 2010/0084727 A1 | 4/2010 | Makino et al. | |
| 2012/0056251 A1 | 3/2012 | Kudoh | |

FOREIGN PATENT DOCUMENTS

| | | |
|---|---|---|
| CN | 101271911 A | 9/2008 |
| JP | 2000224495 A | 8/2000 |
| JP | 2000-269472 A | 9/2000 |
| JP | 2002-318638 A | 10/2002 |
| JP | 2004-254080 A | 9/2004 |
| JP | 2005-184634 A | 7/2005 |
| JP | 2005-347932 A | 12/2005 |
| JP | 2007-189732 A | 7/2007 |
| JP | 2007-288755 A | 11/2007 |
| JP | 2008-048313 A | 2/2008 |
| JP | 2008-099228 A | 4/2008 |
| JP | 2008103870 A | 5/2008 |
| JP | 2008-235681 A | 10/2008 |
| JP | 2009-038781 A | 2/2009 |
| JP | 2010-022063 A | 1/2010 |
| JP | 2010-045082 A | 2/2010 |
| JP | 2010050771 A | 3/2010 |
| JP | 2010114400 A | 5/2010 |

OTHER PUBLICATIONS

Sep. 29, 2015 Office Action issued in Japanese Patent Application No. 2010-186888.
Sep. 1, 2015 Office Action issued in Chinese Patent Application No. 201180040931.9.
Apr. 1, 2014 Office Action issued in Japanese Application No. 2010-186888.
Sep. 6, 2011 International Search Report issued in International Patent Application No. PCT/JP2011/004576.
Feb. 26, 2013 International Preliminary Report on Patentability issued in International Patent Application No. PCT/JP2011/004576.
Feb. 12, 2015 Office Action issued in U.S. Appl. No. 13/813,515.
Sep. 24, 2015 Notice of Allowance issued in U.S. Appl. No. 13/813,515.
Aug. 21, 2015 Notice of Allowance issued in U.S. Appl. No. 13/813,515.
Aug. 13, 2015 Notice of Allowance issued in U.S. Appl. No. 13/813,515.
Jul. 31, 2015 Notice of Allowance issued in U.S. Appl. No. 13/813,515.
Oct. 26, 2015 Office Action issued in Chinese Application No. 201180040931.9.
U.S. Appl. No. 13/813,515, filed Jan. 31, 2013.
Dec. 15, 2015 Office Action issued in Japanese Patent Application No. 2010-186888.
May 13, 2016 Office Action issued in Chinese Application No. 201180040931.9.
Oct. 27, 2016 Office Action Issued in U.S. Appl. No. 14/936,035.
Nov. 7, 2016 Office Action issued in Chinese Application No. 201180040931.9.
Mar. 3, 2016 Office Action issued in U.S. Appl. No. 14/936,035.

\* cited by examiner

IMAGING DEVICE

The present application is a Continuation Application of U.S. patent application Ser. No. 14/936,035 filed Nov. 9, 2015, which is a Continuation Application of U.S. patent application Ser. No. 13/813,515, a U.S. National Stage application filed Jan. 31, 2013 and claiming the benefit of International Application No. PCT/JP2011/004576, filed Aug. 12, 2011, which claims a priority date of Aug. 24, 2010 based on prior filed Japanese Application No. 2010-186888. The entire contents of the aforementioned applications are all incorporated herein by reference.

TECHNICAL FIELD

The present application relates to an imaging device.

BACKGROUND ART

Generally, digital video cameras and digital cameras have CMOS-type imaging devices or CCD-type imaging devices mounted thereon. For example, a CMOS type imaging device has a sensor chip which converts an image of a subject into electrical signals, a signal processing chip which processes signals output from the sensor chip, or the like. The sensor chip and the signal processing chip are coupled to each other by wire bonding or the like.

The sensor chip has, for example, a pixel array in which a plurality of pixels is arranged in a 2-dimensional matrix and sequentially outputs analog electrical signals generated by each pixel to the signal processing chip. The signal processing chip has, for example, an A/D converter and sequentially converts the analog signals received from the sensor chip into digital signals.

In recent years, imaging devices having the function of a signal processing chip such as an A/D converter provided within a sensor chip have been proposed (see Patent Document 1, for example). A sensor chip of this type has, for example, an A/D converter in each column of the pixel array. Accordingly, it is possible to speed up A/D conversion processing in comparison with the above-mentioned prior art which outputs the analog pixel signals output from the pixel array to the signal processing chip in a serial form, and which converts them into digital data.

Patent Document 1: Japanese Unexamined Patent Application Publication No. 2008-48313

DISCLOSURE

Problems to be Solved

However, with the configuration (single-chip configuration) having the function of the signal processing chip such as an A/D converter provided within the sensor chip, there is a difference between the manufacturing process suitable for improving the performance of the sensor unit such as the pixel array and the manufacturing process suitable for speeding up the signal processing unit such as an A/D converter, which makes the manufacturing process of imaging devices complicated. For example, the dynamic range is expanded in the sensor unit by raising the driving voltage (power supply voltage), and the influence of noise is reduced. In contrast, high-speed operation is realized in the signal processing unit by operating microscopic transistors at a low power supply voltage. Therefore, a complicated process control is required to manufacture, on a single chip, a sensor unit which operates at a high power supply voltage and a signal processing unit using a microscopic transistor which operates at a low power supply voltage, thereby making the manufacturing process complicated. Accordingly, the manufacturing cost of the imaging device increases.

Note that, when the sensor unit and the signal processing unit are manufactured on a single chip through the use of the manufacturing process suitable for one of the sensor unit and the signal processing unit in order to reduce the manufacturing cost, performance of the imaging device decreases. For example, the use of a manufacturing process which gives a higher priority to improving the performance of the sensor unit results in insufficient miniaturization of transistors of the signal processing unit, which may lead to an increased area of the signal processing unit and increased power consumption. Alternatively, the use of a manufacturing process which gives a higher priority to miniaturization of transistors of the signal processing unit results in a narrower dynamic range because the pressure resistance of transistors or the like of the sensor unit becomes lower.

It is a proposition of the present application to speed up the operation of an imaging device, while reducing the manufacturing cost.

Means for Solving the Problems

An imaging device has a sensor chip and a signal processing chip. The sensor chip includes a pixel array in which a plurality of pixels are arranged in a 2-dimensional matrix and a data output terminal group made up of a plurality or data output terminals which output analog signals of pixels for each pixel column of the pixel array. The signal processing chip includes a data input terminal group electrically coupled to the data output terminal group, a plurality of A/D converters which convert the analog signals of pixels received by the data input terminal group into digital signals for each pixel column of the pixel array, and a control unit which controls operation of the plurality of A/D converters.

DETAILED DESCRIPTION OF THE EMBODIMENTS

Figure 1:
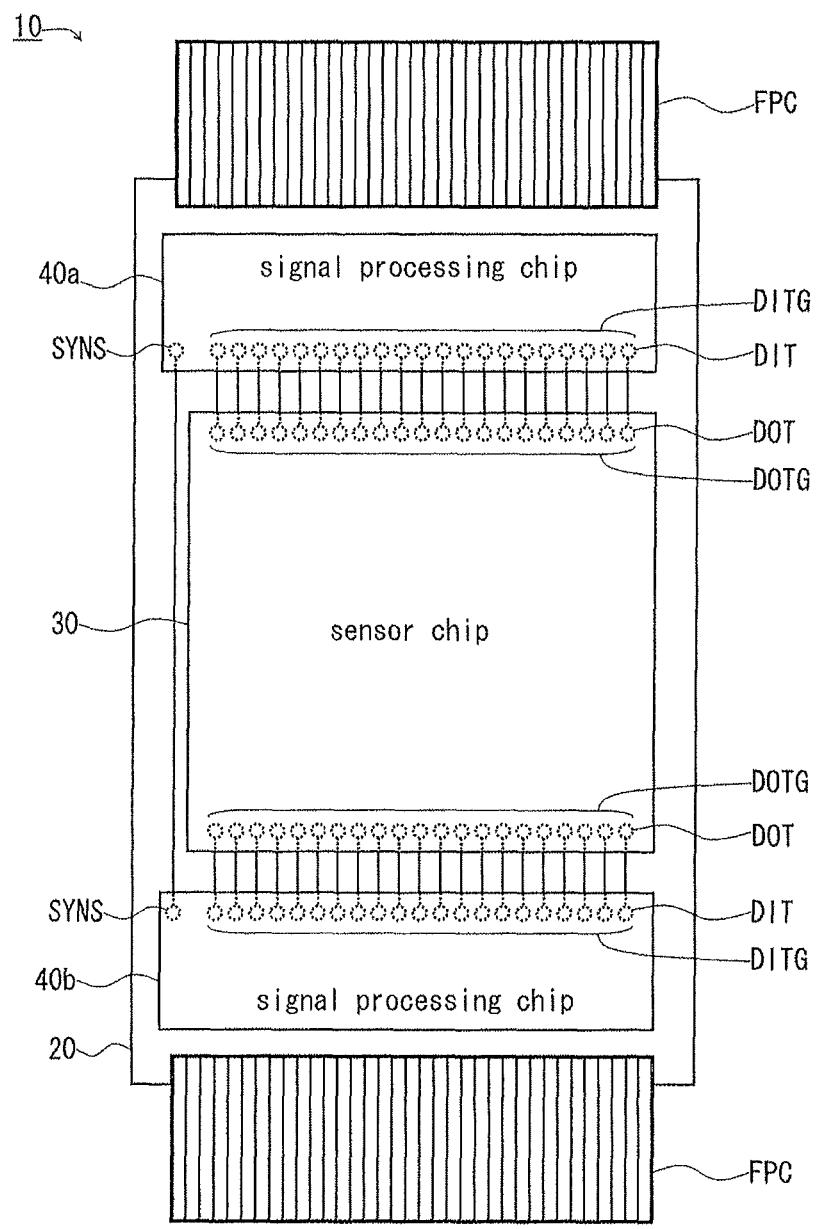
FIG. 1 is a diagram illustrating an overview of an imaging device in one embodiment.

In the following, embodiments of the present invention will be described using the drawings. Some of the signal, signal line, and terminal in the drawings collectively show a plurality of such components. For example, in the following explanation, a plurality of control signals for controlling the driving timing of a sensor chip 30 is collectively referred to as a driving control signal CNTP.

FIG. 1 shows an embodiment of the present invention. Note that FIG. 1 shows the overall imaging device 10 seen from the other side of the incidence plane of light. The imaging device 10 of this embodiment is, for example, a CMOS type imaging device and mounted on a digital video camera, a digital camera or the like. For example, the imaging device 10 has a glass plate 20 with a wiring pattern formed thereon, a sensor chip 30, and a plurality of signal processing chips 40 (40a and 40b), and is formed based on a COG (Chip On Glass) structure.

The glass plate 20 has the sensor chip 30 and the plurality of signal processing chips 40a and 40b mounted thereon. For example, the signal processing chips 40a and 40b are arranged at the top and the bottom of the drawing with the sensor chip 30 sandwiched therebetween. In addition, the glass plate 20 has a flexible printed circuit FPC coupled thereto, for example. For example, signals are input to and output from the imaging device 10 via the flexible printed circuit FPC and a wiring formed on the glass plate 20.

The sensor chip 30 has, for example, a plurality of data output terminal groups DOTG, each including a plurality of data output terminals DOT arranged horizontally in the drawing. The plurality of data output terminal groups DOTG are provided respectively corresponding to a plurality of signal processing chips 40. For example, in the imaging device 10 having two signal processing chips 40a and 40b, two data output terminal groups DOTG are provided respectively on the side of the signal processing chips 40a and 40b of the sensor chip 30. As thus described, the sensor chip 30 has a same number of the data output terminal groups DOTG as the number of the signal processing chips 40. Note that the data output terminals DOT are provided on the side of the glass plate 20 of the sensor chip 30, and thus they are shown in FIG. 1 by dashed lines.

Each of the signal processing chips 40 has, for example, a data input terminal group DITG including a plurality of data input terminals DIT arranged horizontally in the drawing, and a synchronous control terminal SYNS. The data input terminals DIT and the synchronous control terminal SYNS are provided on the side of the glass plate 20 of the signal processing chips 40, and thus they are shown by dashed lines in FIG. 1. In the following, the same reference numerals as signal names are used for terminals other than the data output terminals DOT and the data input terminals DIT.

The data input terminals DIT of the signal processing chips 40a and 40b receive signals output from the data output terminals DOT of the sensor chip 30 (signals of pixels PX shown in FIG. 3 described below). That is, the data input terminal group DITG is electrically coupled to the data output terminal group DOTG. For example, the data input terminal group DITG of the signal processing chips 40a and 40b are respectively coupled to two data output terminal groups DOTG of the sensor chip 30 by a wiring pattern formed on the glass plate 20.

In addition, the synchronous control terminals SYNS of the signal processing chips 40a and 40b are coupled to each other by a wiring pattern formed on the glass plate 20. Accordingly, the synchronous control signal SYNS described in FIG. 4, for example, is transmitted to the synchronous control terminal SYNS of each of the signal processing chips 40. Note that the wiring coupling between the synchronous control terminals SYNS of the signal processing chips 40a and 40b may pass through the sensor chip 30. For example, the wiring coupling between the synchronous control terminals SYNS of the signal processing chips 40a and 40b may include a wiring pattern formed on the glass plate 20 and a wiring pattern formed on the sensor chip 30.

Figure 2:
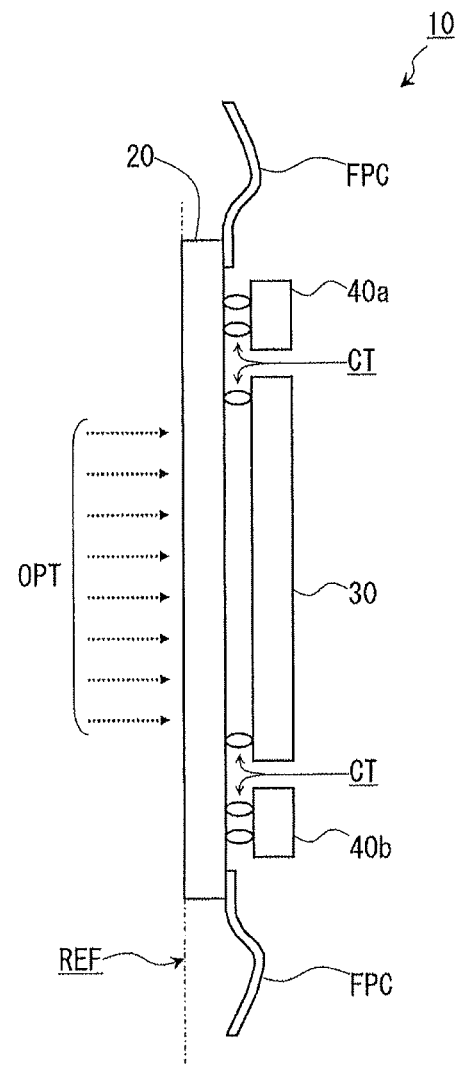
FIG. 2 is a diagram illustrating an overview of a side surface of the imaging device illustrated in FIG. 1.

FIG. 2 shows the overall side surface of the imaging device 10 shown in FIG. 1. The imaging device 10 is formed with a COG structure as described above, for example. The sensor chip 30, the signal processing chips 40a and 40b, and the flexible printed circuit FPC are joined on a plane on the other side of the mounting reference surface REF of the glass plate 20. The sensor chip 30 and the plurality of signal processing chips 40a and 40b are electrically coupled to the glass plate 20 by a joint part CT such as, for example, solder, bump or the like. For example, the glass plate 20 side of the joint part CT is joined to a wiring pattern formed on the glass plate 20. In addition, for example, the sensor chip 30 side of the joint part CT is joined to a terminal of the sensor chip 30, and the signal processing chip 40 side of the joint part CT is joined to a terminal of the signal processing chip 40. Note that, light OPT is incident on the sensor chip 30 via the glass plate 20.

Figure 3:
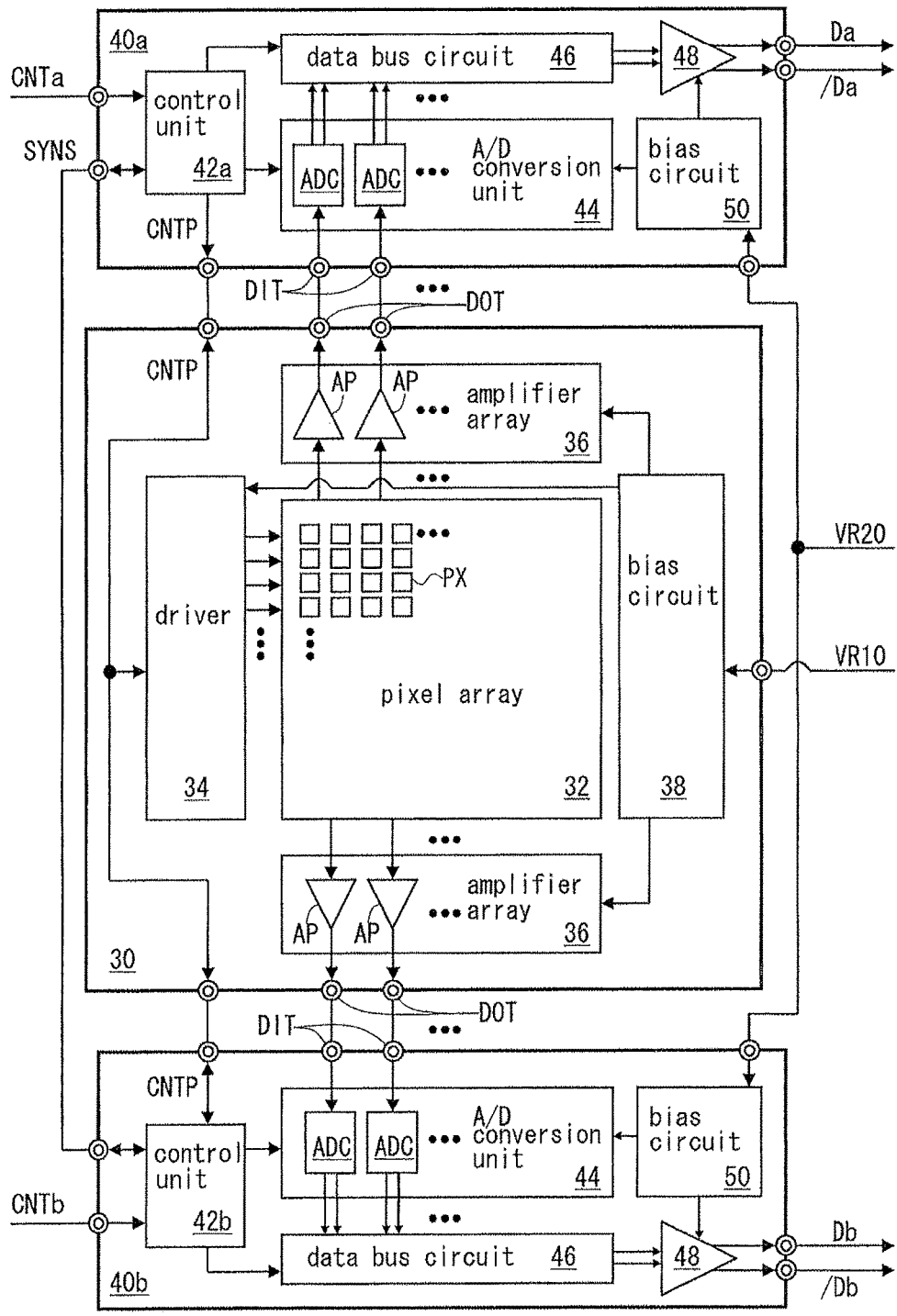
FIG. 3 is a diagram illustrating an overview of a sensor chip and a signal processing chip illustrated in FIG. 1.

FIG. 3 shows the overall sensor chip 30 and the signal processing chip 40 shown in FIG. 1. Note that, the double circle in FIG. 3 shows a part of the terminals of the sensor chip 30 and the signal processing chip 40. For example, driving control terminals CNTP of the signal processing chips 40a and 40b are respectively coupled to two driving control terminals CNTP of the sensor chip 30 by a wiring pattern formed on the glass plate 20 shown in FIG. 1.

The sensor chip 30 has a plurality of terminals including the data output terminals DOT or the like, a pixel array 32, a driver 34, amplifier arrays 36 arranged divided into two parts, and a bias circuit 38. The pixel array 32 has a plurality of pixels PX provided in a 2-dimensional matrix. For example, the pixel PX has a photoelectric conversion part which performs photoelectric conversion of incident light to generate electric charge, and generates an electrical signal according to the incident light. For example, the electric signal generated by the pixel PX is an analog signal. The driver 34 receives the driving control signal CNTP from the signal processing chip 40 via the driving control terminal CNTP. Then, the driver 34 controls, based on the driving control signal CNTP, the pixels PX in the pixel array 32 for each row.

The amplifier arrays 36 are arranged at the top and the bottom of the drawing with the pixel array 32 sandwiched therebetween, for example. For example, one of the two amplifier arrays 36 (the amplifier array 36 arranged at the top of FIG. 3) has a column amplifier AP provided for each odd-numbered column of the pixel array 32. In addition, for example, the other one of the two amplifier arrays 36 (the amplifier array 36 arranged at the bottom of FIG. 3) has a column amplifier AP provided for each even-numbered column of the pixel array 32.

The column amplifier AP arranged for each column of the pixel array 32 receives signals of pixels PX in a row selected by the driver 34, and amplifies the received signals with a predetermined amplification factor. Then, the column amplifier AP outputs the amplified signals to the signal processing chip 40 via the data output terminals DOT. That is, the amplifier array 36 outputs signals of the pixels PX in a row selected by the driver 34 to the signal processing chip 40 in parallel, via the data output terminals DOT. For example, signals of the pixels PX in odd-numbered columns of the pixel array 32 are output, in parallel, from the plurality of data output terminals DOT arranged at the top of the drawing of the sensor chip 30 to the plurality of data input terminals DIT of the signal processing chip 40a. In addition, for example, signals of the pixels PX in even-numbered columns of the pixel array 32 are output, in parallel, from the plurality of output terminals DOT arranged at the bottom of the drawing of the sensor chip 30 to the plurality of data input terminals DIT of the signal processing chip 40b. Note that the column amplifier AP operating as an amplifier includes, for example, a switched capacitor circuit.

As thus described, since signals of the pixels PX in a single row are output in parallel from the sensor chip 30 to the signal processing chip 40 in the above-mentioned embodiment, the transfer time of signals of the pixels PX in a single row between chips (between the sensor chip 30 and the signal processing chip 40) can be shortened. Alternatively, it also becomes possible in this embodiment to lower the speed of the read operation of signals per pixel PX, for example, pixel resetting, resetting of the column amplifier, charge transfer to floating diffusion, and signal amplification of the column amplifier, or the like compared with a configuration which sequentially outputs signals of the pixels PX in a single row from the sensor chip 30 to the signal processing chip 40. In this case, sufficient stabilization period can be taken, and thus operation of each unit is stabilized.

The bias circuit 38 receives a reference voltage VR10 from outside the sensor chip 30 via a reference voltage terminal VR10. Then, the bias circuit 38 generates the power supply voltage or the like to be supplied to the pixel array 32, the driver 34, and the amplifier array 36, based on the reference voltage VR10.

The signal processing chips 40a and 40b are configured identically to each other in this embodiment. Therefore, the signal processing chip 40a will be described in the following. The signal processing chip 40a has a plurality of terminals including the data input terminals DIT, a control unit 42a, an A/D conversion unit 44, a data bus circuit 46, a differential output circuit 48, and a bias circuit 50.

The control unit 42a controls the operation of the A/D conversion unit 44, the data bus circuit 46, or the like. In addition, the control unit 42a has a master mode which controls the operation of another control unit 42 (e.g., control unit 42b) and a slave mode which operates based on control from another control unit 42 (e.g., control unit 42b). For example, the control unit 42a is set to either the master mode or the slave mode according to a control signal CNTa received from outside the signal processing chip 40a via a control terminal CNTa.

When set to the master mode, for example, the control unit 42a outputs, to the sensor chip 30, the driving control signal CNTP to control the driving timing of the sensor chip 30, via the driving control terminal CNTP. Furthermore, the control unit 42a outputs, the signal processing chip 40b, the synchronous control signal SYNS for synchronizing the operation of the control unit 42a in the master mode and the operation of the control unit 42b in the slave mode with each other, via the synchronous control terminal SYNS. That is, the control unit 42a which is set to the master mode outputs the synchronous control signal SYNS for synchronizing the operations of the control units 42a and 42b of a plurality of signal processing chips 40a and 40b with each other to the control unit 42b of the other signal processing chip 40b, and also outputs the driving control signal CNTP to the sensor chip 30.

In addition, when being set to the slave mode, the control unit 42a receives the synchronous control signal SYNS from the signal processing chip 40b, via the synchronous control terminal SYNS, Furthermore, the control unit 42a in the slave mode receives, from the sensor chip 30, the driving control signal CNTP which has been output to the sensor chip 30 from the control unit 42b in the master mode, for example, via the driving control terminal CNTP.

The A/D conversion unit 44 has, for example, a plurality of A/D converters ADC (also referred to as column A/D converter ADC in the following) provided respectively corresponding to a plurality of data input terminals DIT of the signal processing chip 40a. For example, in the signal processing chip 40a, a plurality of column A/D converters ADC respectively receives analog signals of the pixels PX in odd-numbered columns of the pixel array 32 via a vertical signal line provided for each column of the pixel array 32, and converts the received analog signals into digital signals. Then, each A/D converter ADC differentially outputs, to the data bus circuit 46, the signals of the pixels PX which have been converted into digital signals, for example. Note that the plurality of column A/D converters ADC operates in parallel, based on the control by the control unit 42a.

As thus described, the A/D conversion unit 44 is included in a processing unit which processes signals of the pixels PX received in the data input terminal group DITG. Note that, in the embodiment, a plurality of column A/D converters ADC of the A/D conversion unit 44 operates in parallel, whereby the conversion time of analog signals of the pixels PX in a single row into digital signals can be shortened. Alternatively, in this embodiment, it is also possible to lower the speed of the conversion operation per A/D converter ADC, in comparison with a configuration which sequentially outputs signals of the pixels PX in a single row from the sensor chip 30 to the signal processing chip 40. As a result, increase of the area of the A/D converter ADC and increase of power consumption can be suppressed.

The data bus circuit 46 has, for example, a bus coupling the A/D converter ADC and the differential output circuit 48 and operates based on the control by the control unit 42a. For example, the data bus circuit 46 sequentially transfers, to the differential output circuit 48, signals of the pixels PX which have been output in a differential manner from the A/D converter ADC, based on the control by the control unit 42a. In addition, for example, the data bus circuit 46 performs resetting of the bus, based on the control by the control unit 42a.

The differential output circuit 48 outputs low-amplitude differential signals by using an LVDS (Low Voltage Differential Signaling) interface, for example. For example, the differential output circuit 48 sequentially receives, from the data bus circuit 46, signals of the pixels PX which have been converted into differential digital signals by the A/D converter ADC, and sequentially outputs the received differential signals as digital pixel signals Da, /Da which are low-amplitude differential signals. Note that the differential output circuit 48 may use a digital interface supporting high-speed transfer other than the LVDS interface. Through the use of a digital interface such as the LVDS interface, the signal processing chip 40a can output the digital pixel signals Da, /Da corresponding to the pixels PX in odd-numbered columns of the pixel array 32, at a high speed from digital pixel output terminals Da, /Da to the outside.

The bias circuit 50 receives a reference voltage VR20 from outside the signal processing chip 40a via a reference voltage terminal VR20. Then, the bias circuit 50 generates a power supply voltage or the like to be supplied to the control unit 42a, the A/D conversion unit 44, the data bus circuit 46, and the differential output circuit 48, based on the reference voltage VR20, In FIG. 3, for clarity of the figure, description of the wiring for supplying voltage to the control unit 42a and the data bus circuit 46 from the bias circuit 50 is omitted.

The operation of the signal processing chip 40b is described by replacing the reference numerals 40a, 40b, 42a, 42b, CNTa, Da, /Da by the reference numerals 40b, 40a, 42b, 42a, CNTb, Db, /Db, respectively, and replacing the "pixels PX in odd-numbered columns" by the "pixels PX in even-numbered columns". For example, the signal processing chip 40b outputs digital pixel signals Db, /Db corresponding to the pixels PX in even-numbered columns of the pixel array 32, to the outside from the digital pixel output terminals Db, /Db.

As thus described, since digital pixel signals D, ID ("Da, /Da", "Db, /Db") are output in parallel from a plurality of signal processing chips 40 (40a, 40b) in this embodiment, A/D conversion processing for one frame and transfer time of the digital pixel signals D, /D can be shortened. In addition, since the sensor chip 30 and the signal processing chip 40 can be manufactured by different manufacturing processes in this embodiment, the sensor chip 30 and the signal processing chip 40 can be manufactured by manufacturing processes suitable for their respective properties. For example, the signal processing chip 40 can be manufactured by a manufacturing process suitable for speeding up the signal processing unit such as the A/D converter ADC, even when the sensor chip 30 has been manufactured by a manufacturing process suitable for enhancing the performance of the sensor unit such as the pixel array 32. Therefore, in this embodiment, it is possible to speed up the operation of the imaging device 10, while reducing the manufacturing cost of the imaging device 10.

Note that the signal processing chip 40 may have, in addition to the A/D conversion unit 44, a signal processing circuit which performs digital computation or the like. For example, the signal processing chip 40 may have a circuit which corrects unevenness of the conversion properties between a plurality of column A/D converters ADC, a circuit which removes fixed-pattern noise, or the like.

Figure 4:
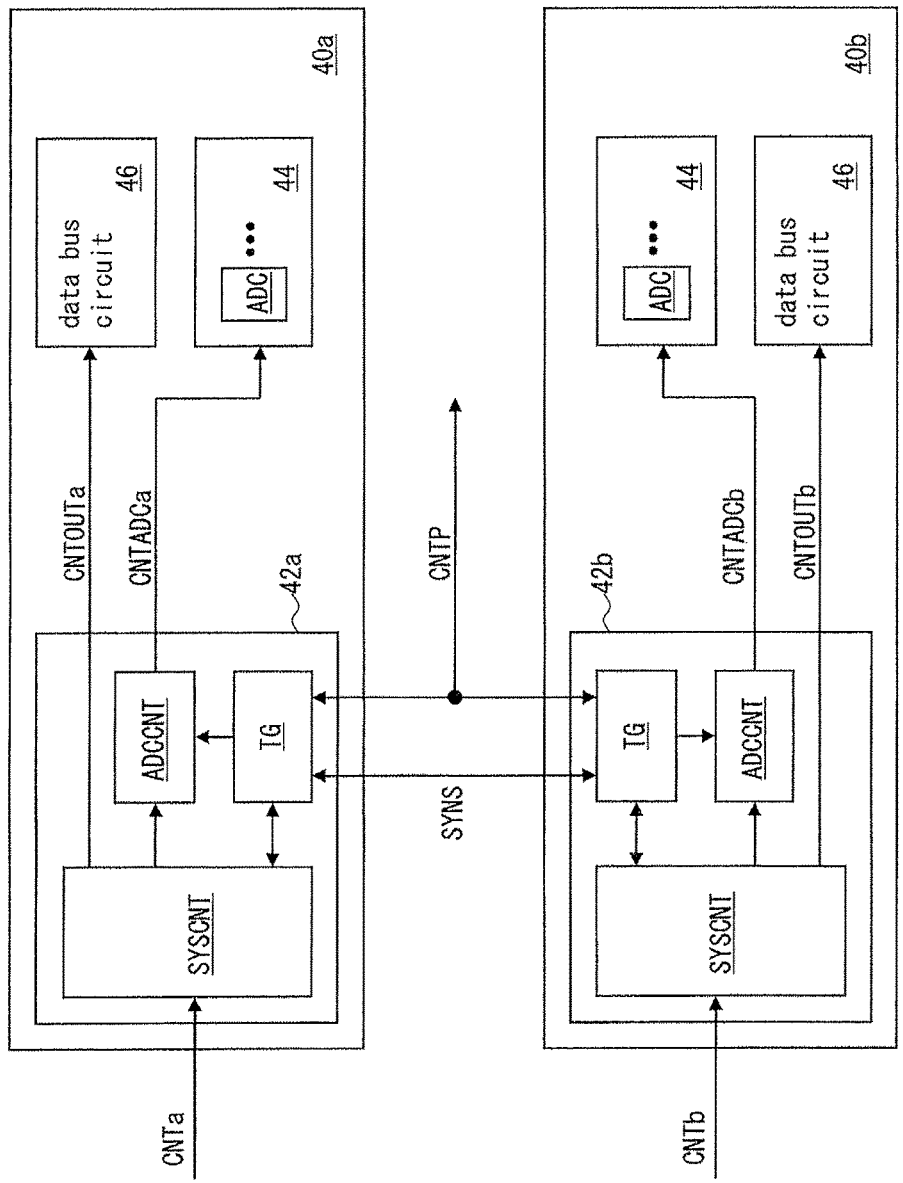
FIG. 4 is a diagram illustrating an example of a control unit illustrated in FIG. 3.

FIG. 4 shows an example of the control unit 42 shown in FIG. 3. Note that, in FIG. 4, description of the differential output circuit 48, the bias circuit 50, or the like shown in FIG. 3 is omitted. Since the control units 42a and 42b are configured identically to each other, the control unit 42a will be described.

The control unit 42a has a system controller SYSCNT which receives the control signal CNTa, an A/D conversion control circuit ADCCNT which controls the operation of the A/D converter ADC, and a timing generator TG. The system controller SYSCNT operates either in the master mode or n the slave mode, based on the control signal CNTa. Then, the system controller SYSCNT controls the A/D conversion control circuit ADCCNT of the control unit 42a and the timing generator TG so that the control unit 42a operates in the mode set by the control signal CNTa. That is, the operation of the control unit 42a differs between the master mode and the slave mode.

In the following, assuming that the control unit 42a is set to the master mode and the control unit 42b is set to the slave mode, the operation of the timing generator TG of the control unit 42a, the system controller SYSCNT of the control unit 42a, and the A/D conversion control circuit ADCCNT of the control unit 42a will be described.

The timing generator TG generates the driving control signal CNTP, and outputs the generated driving control signal CNTP to the timing generator TG of the control unit 42b and the driver 34 of the sensor chip 30 shown in FIG. 3. In addition, the timing generator TG outputs, for example, a timing control signal based on the driving control signal CNTP, to the system controller SYSCNT and the A/D conversion control circuit ADCCNT.

Furthermore, the timing generator TG outputs the synchronous control signal SYNS to the timing generator TG of the control unit 42b. For example, the synchronous control signal SYNS includes a clock in the control signal CNTa. The timing generator TG receives the clock in the control signal CNTa via, for example, the system controller SYSCNT. The timing generator TG may receive the clock in the control signal CNTa, without via the system controller SYSCNT.

The system controller SYSCNT generates an output control signal CNTOUTa based on, for example, the timing control signal from the timing generator TG, and outputs the output control signal CNTOUTa to the data bus circuit 46 in synchronization with the clock in the control signal CNTa. For example, the output control signal CNTOUTa is a signal for controlling the operation of the data bus circuit 46. Note that the system controller SYSCNT may control the operation of the differential output circuit 48 shown in FIG. 3 by using, for example, the output control signal CNTOUTa.

The A/D conversion control circuit ADCCNT generates an A/D conversion control signal CNTADCa based on the timing control signal from the timing generator TG, for example, and outputs the A/D conversion control signal CNTADCa to the A/D conversion unit 44 in synchronization with the clock in the control signal CNTa. For example, the A/D conversion control circuit ADCCNT receives the clock in the control signal CNTa, via the system controller SYSCNT. Note that the A/D conversion control circuit ADCCNT may receive the clock in the control signal CNTa, without via the system controller SYSCNT. Here, for example, the A/D conversion control signal CNTADCa is a signal for controlling the operation of the A/D conversion unit 44.

Next, the operation of the timing generator TG of the control unit 42b which is set to the slave mode, the system controller SYSCNT of the control unit 42b which is set to the slave mode, and the A/D conversion control circuit ADCCNT of the control unit 42b which is set to the slave mode will be described.

The timing generator TG receives, for example, the synchronous control signal SYNS including the clock in the control signal CNTa from the timing generator TG of the control unit 42a. Then, the timing generator TG transfers, to the system controller SYSCNT and the A/D conversion control circuit ADCCNT, the clock in the control signal CNTa which has been transferred by the synchronous control signal SYNS.

In addition, the timing generator TG generates a timing control signal based on the driving control signal CNTP received from the timing generator TG of the control unit 42a, and outputs the generated timing control signal to the system controller SYSCNT and the A/D conversion control circuit ADCCNT. Note that the timing generator TG operating in the slave mode does not output the driving control signal CNTP to the sensor chip 30 shown in FIG. 3.

The system controller SYSCNT generates an output control signal CNTOUTb based on the timing control signal from, for example, the timing generator TG. Then, the system controller SYSCNT outputs the output control signal CNTOUTb to the data bus circuit 46 in synchronization with the clock in the control signal CNTa received from the timing generator TG.

The A/D conversion control circuit ADCCNT generates an A/D conversion control signal CNTADCb based on the timing control signal from the timing generator TG, for example. Then, the A/D conversion control circuit ADCCNT outputs the A/D conversion control signal CNTADCb to the A/D conversion unit 44 in synchronization with the clock in the control signal CNTa received from the timing generator TG.

Note that the operation of the control unit 42 is not limited to the example described above. For example, the synchronization clock to be transferred by the synchronous control signal SYNS may be a clock resulting from frequency-dividing the clock in the control signal CNTa, or a clock resulting from multiplying the clock in the control signal CNTa. Alternatively, synchronization clocks to be transferred by the synchronous control signal SYNS may be a plurality of clocks. For example, if the clock used when outputting the output control signal CNTOUTa and the clock used when outputting the A/D conversion control signal CNTADCa are different from each other, both clocks may be transferred by the synchronous control signal SYNS.

As thus described, the control unit 42b which is set to the slave mode operates in synchronization with the dock used in the control unit 42a which is set to the master mode. That is, the control units 42a and 42b operate in synchronization with each other. Accordingly in this embodiment, the operation timings of the sensor chip 30 and the plurality of signal processing chips 40a and 40b can be matched with each other. As a result, in this embodiment, occurrence of an error can be prevented between, for example, the digital pixel signals Da, /Da of the signal processing chip 40a and the digital pixel signals Db, /Db of the signal processing chip 40b. Here, an error between the digital pixel signals Da, /Da and the digital pixel signals Db, /Dbt occur due to, for example, difference of operation timings of the A/D conversion unit 44, difference of operation timings of the data bus circuit 46, or the like.

For example, there is a possibility that the difference of operation timings between the A/D conversion unit 44 of the signal processing chip 40a and the A/D conversion unit 44 of the signal processing chip 40b results in a gap in acquisition timings of analog data. If there is a gap in acquisition timings of analog data between the signal processing chips 40a and 40b, the data after A/D conversion of signals of the pixels PX having the same level with each other, for example, significantly differ between the signal processing chips 40a and 40b. Note that, in this embodiment, since the control units 42a and 42b operate in synchronization with each other, occurrence of a gap in acquisition timing of analog data between the signal processing chips 40a and 40b can be prevented. As a result, occurrence of a significant error can be prevented between the data after A/D conversion of the signal processing chip 40a and the data after A/D conversion of the signal processing chip 40b.

In addition, for example, the difference of the operation timing between the data bus circuit 46 of the signal processing chip 40a and the data bus circuit 46 of the signal processing chip 40b may generate a large phase difference between digital outputs of the signal processing chips 40a and 40b (between the digital pixel signals Da, /Da and Db, /Db). When the phase difference is large, the phase margin of data take-in on the side of the image processing IC receiving the digital pixel signals Da, /Da, Db, /Db is reduced, which may result in a higher probability of failure in data take-in. Note that, in this embodiment, since the control units 42a and 42b operate in synchronization with each other, it is possible to prevent the phase difference between digital outputs of the signal processing chips 40a and 40b from becoming larger. As a result, the phase margin of data take-in on the side of the image processing IC receiving the digital pixel signals Da, /Da, Db, /Db can be increased, and thus the probability of failure in data take-in can be reduced.

Note that, when the control unit 42a is set to the slave mode and the control unit 42b is set to the master ode, operations of the control units 42a and 42b becomes reversed to each other.

As has been described above, the imaging device 10 in this embodiment has the sensor chip 30 and the plurality of signal processing chips 40a and 40b, which operate in synchronization with each other. For example, in this embodiment, the operation timing of the sensor chip 30 and the plurality of signal processing chips 40a and 40b can be matched with each other by using the synchronous control signal SYNS. Furthermore, in this embodiment, the sensor chip 30 and the signal processing chip 40 can be manufactured by manufacturing processes suitable for respective properties. Accordingly, in this embodiment, it is possible to speed up the operation of the imaging device 10, while reducing the manufacturing cost of the imaging device 10. In addition, since the signal processing chips 40a and 40b are configured identically to each other in this embodiment, it is possible to reduce design man-hour such as layout design or design inspection.

Furthermore, in this embodiment, the control unit 42 is set to either the master mode or the slave mode by the control signal CNT. Therefore, in this embodiment, power consumption of the imaging device 10 can be reduced in comparison with a configuration in which a plurality of control units 42 performs a process similar to the master mode. In addition, for example, in the test process at the time of manufacturing, the signal processing chip 40 can be tested alone by setting the control unit 42 to the master mode. Accordingly, in this embodiment, it is possible to prevent a defective signal processing chip 40 from being mounted on the glass plate 20 shown in FIG. 1. As a result, manufacturing cost of the imaging device 10 can be reduced. Note that, when testing the sensor chip 30 alone, it suffices to input a test control signal from the driving control terminal CNTP to the sensor chip 30. Alternatively, a test terminal or wiring for inputting a test control signal may be provided in the sensor chip 30.

Furthermore, in this embodiment, although a configuration has been described in which the plurality of signal processing chips 40a and 40b operates in synchronization with each other according to the synchronous control signal SYNS, the invention is not limited to the configuration. For example, a configuration only with the signal processing chip 40 divided into two parts (a configuration not using the synchronous control signal SYNS) may be employed. In this case, an effect similar to that of the above-mentioned embodiment can be obtained in that the sensor chip 30 and the signal processing chip 40 can be manufactured by manufacturing processes suitable for respective properties. However, a configuration in which a plurality of control units 42 is respectively formed on a plurality of signal processing chips 40 which is different from each other tends to exhibit, for example, a larger manufacturing variability between the plurality of control units 42 in comparison with a configuration in which the plurality of control units 42 are provided in a single chip. Therefore, with the configuration which does not use the synchronous control signal SYNS, clock timings in a plurality of signal processing chips 40 may differ from each other due to manufacturing variability between the plurality of signal processing chips 40, As a result, if it is necessary to avoid the influence due to manufacturing variability between the plurality of signal processing chips 40, a configuration is preferable in which the plurality of signal processing chips 40a and 40b is operated in synchronization with each other in accordance with the synchronous control signal SYNS.

Figure 5:
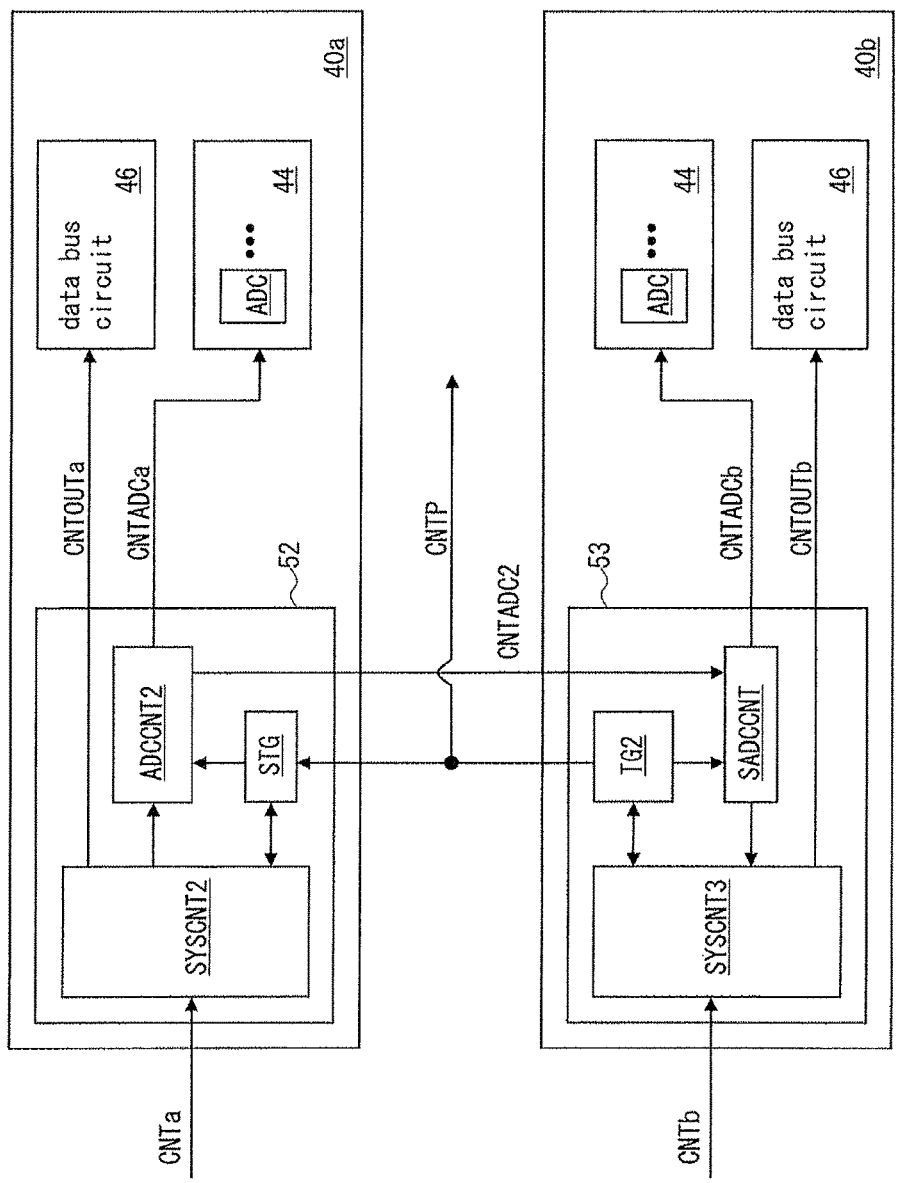
FIG. 5 is a diagram illustrating an example of a control unit of an imaging device in another embodiment.

FIG. 5 shows an example of the control units 52 and 53 of the imaging device 10 in another embodiment. Components that are similar to those described in the above-mentioned embodiment are attached to the same reference numerals, with detailed description thereof being omitted. In the imaging device 10 of this embodiment, the configuration of the signal processing chips 40a and 40b is different from the embodiment described in FIGS. 1 to 4. The rest of the configuration is identical to the embodiment described in FIGS. 1 to 4. Note that, in FIG. 5, description of the differential output circuit 48, the bias circuit 50 or the like shown in FIG. 3 is omitted.

The signal processing chip 40a of this embodiment is provided with a control unit 52 and an A/D conversion control terminal CNTADC2, respectively, in place of the control unit 42a and the synchronous control terminal SYNS shown in FIG. 4. In addition, the signal processing chip 40b of this embodiment is provided with a control unit 53 and the A/D conversion control terminal CNTADC2, respectively, in place of the control unit 42b and the synchronous control terminal SYNS shown in FIG. 4. The rest of the configuration of the signal processing chips 40a and 40b of this embodiment is identical to the embodiment described in FIGS. 1 to 4. Note that the control units 52 and 53 are configured differently from each other. Therefore, the signal processing chips 40a and 40b are respectively provided with the control units 52 and 53 which are configured differently from each other.

First, the control unit 52 provided in the signal processing chip 40a will be described.

The control unit 52 has, for example, the system controller SYSCNT2 which receives the control signal CNTa, the A/D conversion control circuit ADCCNT2 which controls the operation of the A/D converter ADC, and a simple timing generator STG. In addition, the control unit 52 has a test mode for testing the signal processing chip 40a alone. For example, the control unit 52 is set to the test mode by the control signal CNTa.

The simple timing generator STG receives the driving control signal CNTP from the timing generator TG2 of the control unit 53. Then, the simple timing generator STG generates a timing control signal based on the driving control signal CNTP, and outputs the generated timing control signal to the system controller SYSCNT2 and the A/D conversion control circuit ADCCNT2.

In addition, if the control unit 52 is set to the test mode, the simple timing generator STG generates, for example, a minimum timing control signal necessary for testing the A/D converter ADC and the data bus circuit 46. The simple timing generator STG then outputs the generated timing control signal to the system controller SYSCNT2 and the A/D conversion control circuit ADCCNT2.

As thus described, the simple timing generator SIG does not generate the driving control signal CNTP. Accordingly, in this embodiment, the configuration of the simple timing generator STG can be simplified in comparison with the timing generator TG2 of the control unit 53 or the timing generator TG shown in FIG. 4. Additionally, in this embodiment, since the simple timing generator STG does not generate the driving control signal CNTP, power consumption of the signal processing chip 40a can be reduced.

The system controller SYSCNT2 generates, for example, the output control signal CNTOUTa based on the timing control signal from the simple timing generator STG, and outputs the output control signal CNTOUTa to the data bus circuit 46 in synchronization with the clock in the control signal CNTa. Note that the system controller SYSCNT2 may control the operation of the differential output circuit 48 shown in FIG. 3 through the use of, for example, the output control signal CNTOUTa.

The A/D conversion control circuit ADCCNT2 generates, for example, the A/D conversion control signal CNTADCa based on the timing control signal from the simple timing generator STG, for example, and outputs the A/D conversion control signal CNTADCa to the A/D conversion unit 44 in synchronization with the clock in the control signal CNTa. For example, the A/D conversion control circuit ADCCNT2 receives the clock in the control signal CNTa, via the system controller SYSCNT2. Note that the A/D conversion control circuit ADCCNT2 may receive the clock in the control signal CNTa, without via the system controller SYSCNT2.

Furthermore, the A/D conversion control circuit ADCCNT2 outputs an A/D conversion control signal CNTADC2 to a simple A/D conversion control circuit SADCCNT of the control unit 53. For example, the A/D conversion control signal CNTADC2 includes the A/D conversion control signal CNTADCa and a clock in the control signal CNTa. That is, the synchronous control signal SYNS of the above-mentioned embodiment is included in the A/D conversion control signal CNTADC2.

Next, the control unit 53 provided in the signal processing chip 40b will be described.

The control unit 53 has, for example, the system controller SYSCNT3 which receives the control signal CNTb, the simple A/D conversion control circuit SADCCNT, and the timing generator TG2. In addition, the control unit 53 has a test mode for testing the signal processing chip 40b alone. For example, the control unit 53 is set to the test mode by the control signal CNTb.

The timing generator TG2 generates the driving control signal CNTP, and outputs the generated driving control signal CNTP to the simple timing generator STG of the control unit 52 and the driver 34 of the sensor chip 30 shown in FIG. 3. In addition, the timing generator TG2 outputs, for example, a timing control signal based on the driving control signal CNTP to the system controller SYSCNT3 and the simple A/D conversion control circuit SADCCNT.

The system controller SYSCNT3 generates the output control signal CNTOUTb based on, for example, the timing control signal from the timing generator TG2. The system controller SYSCNT3 then outputs the output control signal CNTOUTb to the data bus circuit 46 in synchronization with the clock in the control signal CNTa transferred by the A/D conversion control signal CNTADC2. For example, the system controller SYSCNT3 receives the clock in the control signal CNTa, via the simple A/D conversion control circuit SADCCNT. The system controller SYSCNT3 may receive the clock in the control signal CNTa either from the timing generator TG2 or from the A/D conversion control terminal CNTADC2.

Moreover, when the control unit 53 is set to the test mode, the system controller SYSCNT3 outputs the output control signal CNTOUTb to the data bus circuit 46, in synchronization with the clock in the control signal CNTb.

The simple A/D conversion control circuit SADCCNT receives the A/D conversion control signal CNTADC2 from the A/D conversion control circuit ADCCNT2 of the control unit 52. Then, the simple A/D conversion control circuit SADCCNT transfers, to the system controller SYSCNT3, the clock in the control signal CNTa which has been transferred by the A/D conversion control signal CNTADC2, Note that the simple A/D conversion control circuit SADCCNT may transfer, to the timing generator TG2, the clock in the control signal CNTa which has been transferred by the A/D conversion control signal CNTADC2.

In addition, the simple A/D conversion control circuit SADCCNT generates the A/D conversion control signal CNTADCb, based on the A/D conversion control signal CNTADCa which has been transferred by the A/D conversion control signal CNTADC2, For example, the simple A/D conversion control circuit SADCCNT generates the A/D conversion control signal CNTADCb by adjusting the timing of the A/D conversion control signal CNTADCa based on the timing control signal from the timing generator TG2. Then, the simple A/D conversion control circuit SADCCNT outputs the A/D conversion control signal CNTADCb to the A/D conversion unit 44, in synchronization with the clock in the control signal CNTa which has been transferred by the A/D conversion control signal CNTADC2.

Note that, when the control unit 53 is set to the test mode, the simple A/D conversion control circuit SADCCNT generates for example, the minimum test signal necessary for testing the A/D converter ADC, based on the timing control signal from the timing generator TG2, The simple A/D conversion control circuit SADCCNT then outputs the test signal to the A/D conversion unit 44, in synchronization with the clock in the control signal CNTb.

As thus described, the simple A/D conversion control circuit SADCCNT generates the A/D conversion control signal CNTADCb by adjusting the timing of the A/D conversion control signal CNTADCa which has been transferred by the A/D conversion control signal CNTADC2. Accordingly, in this embodiment, it is possible to simplify the configuration of the simple A/D conversion control circuit SADCCNT in comparison with the A/D conversion control circuit ADCCNT2 of the control unit 52 and the A/D conversion control circuit ADCCNT shown in FIG. 4, whereby power consumption of the signal processing chip 40b can be reduced.

Note that the configuration of the control units 52 and 53 is not limited to the example described above. For example, the timing generator TG2 may be provided in the control unit 52, and the simple timing generator STG may be provided in the control unit 53. In addition, for example, the simple A/D conversion control circuit SADCCNT may be provided in the control unit 52, and the A/D conversion control circuit ADCCNT2 may be provided in the control unit 53. Alternatively, the control unit 52 may be provided in the signal processing chip 40b, and the control unit 53 may be provided in the signal processing chip 40a.

In addition, the operation of the control units 52 and 53 is not limited to the example described above. For example, the synchronization dock to be transferred by the A/D conversion control signal CNTADC2 may be a dock resulting from frequency-dividing the dock in the control signal CNTa, or a dock resulting from multiplying the clock in the control signal CNTa. Alternatively, synchronization clocks to be transferred by the A/D conversion control signal CNTADC2 may be a plurality of clocks. For example, if the clock used when outputting the control signal CNTOUTa and the clock used when outputting the A/D conversion control signal CNTADCa are different from each other, both clocks may be transferred by the A/D conversion control signal CNTADC2.

As has been described above, also in this embodiment, an effect similar to that of the embodiment described in FIGS. 1 to 4 can be obtained. Furthermore, in this embodiment, the simple timing generator STG is provided in the control unit 52, and the simple A/D conversion control circuit SADCCNT is provided in the control unit 53. Accordingly, the entire circuit size of the plurality of control units 52 and 53 is reduced. Therefore, in this embodiment, the circuit size of the signal processing chips 40a and 40b can be reduced, whereby the chip area can be made smaller. Furthermore, in this embodiment, reduction of the circuit size can result in reduced power consumption of the imaging device 10.

Figure 6:
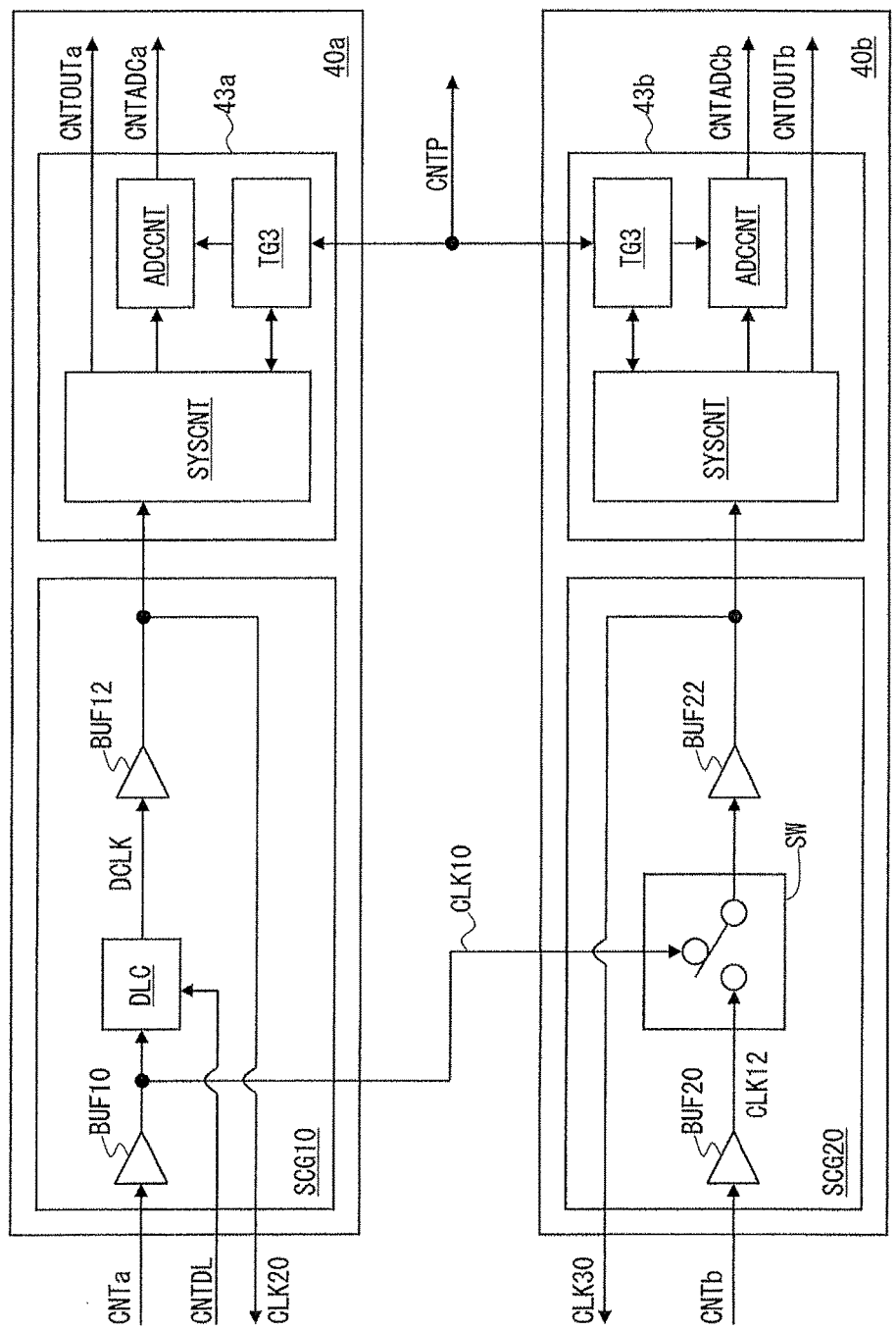
FIG. 6 is a diagram illustrating an example of a signal processing chip of an imaging device in another embodiment.

FIG. 6 shows an example of the signal processing chips 40a and 40b of the imaging device 10 in another embodiment. Components that are similar to those described in the above-mentioned embodiment are attached to the same reference numerals, with detailed description thereof being omitted. In the imaging device 10 of this embodiment, the configuration of the signal processing chips 40a and 40b is different from the embodiment described in FIGS. 1 to 4. The rest of the configuration is identical to the embodiment described in FIGS. 1 to 4. Note that, in FIG. 6, description of the A/D conversion unit 44, the data bus circuit 46, the differential output circuit 48, and the bias circuit 50 or the like shown in FIG. 3 is omitted.

The signal processing chip 40 of this embodiment is provided with a control unit 43 and a clock terminal CLK 10, respectively, in place of the control unit 42 and the synchronous control terminal SYNS shown in FIG. 4. Furthermore, in this embodiment, a synchronous clock generating unit SCG10, a clock terminal CLK 20, and a delay control terminal CNTDL are added to the signal processing chip 40a shown in FIG. 4, and a synchronous clock generating unit SCG20 and a clock terminal CLK 30 are added to the signal processing chip 40b shown in FIG. 4. That is, in this embodiment, the synchronous clock generating units SCG10 and SCG20 are respectively provided in the signal processing chips 40a and 40b forming a pair with each other. The rest of the configuration of the signal processing chips 40a and 40h of this embodiment is similar to the embodiment described in FIGS. 1 to 4.

The signal processing chip 40a has the synchronous clock generating unit SCG10 and the control unit 43a, in addition to the A/D conversion unit 44, the data bus circuit 46, the differential output circuit 48, and the bias circuit 50 shown in FIG. 3.

The synchronous clock generating unit SCG10 has a buffer unit BUF10, a delay circuit DLC, and a buffer unit BUF12. The buffer unit BUF10 receives, for example, a clock in the control signal CNTa from outside the signal processing chip 40a via the control terminal CNTa. Then, the buffer unit BUF10 outputs the received clock (the clock in the control signal CNTa) to the delay circuit DLC and the signal processing chip 40b as a clock CLK 10. Note that the clock terminal CLK 10 of the signal processing chip 40a is coupled to the clock terminal CLK 10 of the signal processing chip 40b by a wiring pattern or the like formed on the glass plate 20 shown in FIG. 1, for example. That is, the clock terminal CLK 10 corresponds to the synchronous control signal SYNS of the embodiment described in FIGS. 1 to 4.

The delay circuit DLC receives the clock CLK 10 from the buffer unit BUF10, and also receives a delay control signal CNTDL from outside the signal processing chip 40a via the delay control terminal CNTDL. Then, the delay circuit DLC outputs, to the buffer unit BUF12, a delay clock DCLK resulting from delaying the clock CLK 10. Note that the delay circuit DLC generates the delay clock DCLK by delaying the clock CLK 10 by a delay amount based on the delay control signal CNTDL.

The buffer unit BUF12 receives the delay clock DCLK from the delay circuit DLC. The buffer unit BUF12 then outputs the delay clock DCLK to the system controller SYSCNT or the like as a clock CLK 20. Accordingly, the clock CLK 20 is supplied to each unit in the signal processing chip 40a, as an internal clock of the signal processing chip 40a. Furthermore, the buffer unit BUF12 outputs the clock CLK 20 to the outside of the signal processing chip 40a via the clock terminal CLK 20.

The control unit 43a has, for example, the system controller SYSCNT, the A/D conversion control circuit ADCCNT, and the timing generator TG3. That is, the control unit 43a is provided with the timing generator TG3 in place of the timing generator TG shown in FIG. 4. The rest of the configuration of the control unit 43a is identical to the control unit 42a shown in FIG. 4. The configuration and operation of the timing generator TG3 are identical to the timing generator TG except that transfer of the synchronous control signal SYNS described in FIG. 4 is not performed.

The operations of the system controller SYSCNT of the control unit 43a and the A/D conversion control circuit ADCCNT of the control unit 43a is identical to the operation described in FIG. 4 except that they operate in synchronization with the clock CLK 20 output from the synchronous clock generating unit SCG10. For example, the system controller SYSCNT of the control unit 43a outputs the output control signal CNTOUTa to the data bus circuit 46 shown in FIG. 4, in synchronization with the clock CLK 20. The A/D conversion control circuit ADCCNT of the control unit 43a outputs the A/D conversion control signal CNTADCa to the A/D conversion unit 44 shown in FIG. 4, in synchronization with the clock CLK 20.

The signal processing chip 40b has the synchronous clock generating unit SCG20 and the control unit 43b, in addition to the A/D conversion unit 44, the data bus circuit 46, the differential output circuit 48, and the bias circuit 50 shown in FIG. 3.

The synchronous clock generating unit SCG20 has a buffer unit BUF20, a switch unit SW, and the buffer unit BUF22. The buffer unit BUF20 receives, for example, a clock in the control signal CNTb from outside the signal processing chip 40b via a control terminal CNTb. Then, the buffer unit BUF20 outputs the received clock (the clock in the control signal CNTb) to the switch unit SW, as a clock CLK 12.

The switch unit SW receives the clock CLK 12 from the buffer unit BUF20, and also receives the clock CLK 10 (the clock in the control signal CNTa) from the signal processing chip 40a via the clock terminal CLK 10. Then, the switch unit SW outputs, for example, either the clock CLK 10 or CLK 12 to the buffer unit BUF22, based on the control signal CNTb. When, for example, the signal processing chips 40a and 40b operate in synchronization with each other, the switch unit SW outputs the dock CLK 10 to the buffer unit BUF22. In addition, when, for example, the signal processing chip 40b operates independently, the switch unit SW outputs the clock CLK 12 to the buffer unit BUF22.

The buffer unit BUF22 outputs the clock received from the switch unit SW to the system controller SYSCNT or the like, as a clock CLK 30. Accordingly, the clock CLK 30 is supplied to each unit in the signal processing chip 40b, as an internal clock of the signal processing chip 40b. Furthermore, the buffer unit BUF22 outputs the clock CLK 30 to the outside of the signal processing chip 40b via the clock terminal CLK 30.

Here, the clocks CLK 20 and CLK 30 which have been output to the outside of the signal processing chips 40a and 40b are used to adjust the amount of delay of the delay circuit DLC. That is, the clocks CLK 20 and CLK 30 are used to adjust the amount of delay indicated by the delay control signal CNTDL. For example, the amount of delay indicated by the delay control signal CNTDL is adjusted by the computation of the CPU of the digital camera or the like on which the imaging device 10 is mounted so that the phase difference between the clock CLK 20 and the clock CLK 30 falls within a predetermined error range. Note that the amount of delay indicated by the delay control signal CNTDL may be manually set by the user. As thus described, in this embodiment, since the phase difference between the clock CLK 20 and the clock CLK 30 is adjusted to fall within a predetermined error range, the operation timing of the signal processing chip 40a can be matched with the operation timing of the signal processing chip 40b with high accuracy.

The configuration of the control unit 43b is identical to that of the control unit 43a, In addition, the operation of the control unit 43b is identical to that operation of the control unit 43a except that the control unit 43b operates in synchronization with the clock CLK 30 output from the synchronous clock generating unit SCG20. For example, the system controller SYSCNT of the control unit 43b outputs the output control signal CNTOUTb to the data bus circuit 46 shown in FIG. 4, in synchronization with the clock CLK 30. The A/D conversion control circuit ADCCNT of the control unit 43b outputs the A/D conversion control signal CNTADCb to the A/D conversion unit 44 shown in FIG. 4, in synchronization with the clock CLK 30. Meanwhile, the driving control signal CNTP is output from, for example, the timing generator TG3 of one the control units 43a and 43b.

Not that the configuration of the signal processing chips 40a and 40b is not limited to example described above. For example, the synchronous clock generating units SCG10 and SCG20 may be respectively provided in the system controller SYSCNT of the signal processing chips 40a and 40b, or may be respectively provided in the timing generator TG3 of the signal processing chips 40a and 40b. Alternatively, the synchronous clock generating units SCG10 and SCG20 may be respectively provided in the A/D conversion control circuit ADCCNT of the signal processing chips 40a and 40b. In addition, the synchronous clock generating unit SCG10 may be provided in the signal processing chip 40b, and the synchronous clock generating unit SCG20 may be provided in the signal processing chip 40a. Furthermore, the synchronous clock generating units SCG10 and SCG20 may be respectively provided in the signal processing chips 40a and 40b shown in FIG. 5.

As has been described above, also in this embodiment, an effect similar to that of the embodiment described in FIGS. 1 to 4 can be obtained. Furthermore, in this embodiment, since the phase difference between the clock CLK 20 and the clock CLK 30 is adjusted so as to fall within a predetermined error range, the operation timing of the sensor chip 30 and the plurality of signal processing chips 40a and 40b can be matched with each other with high accuracy.

Figure 7:
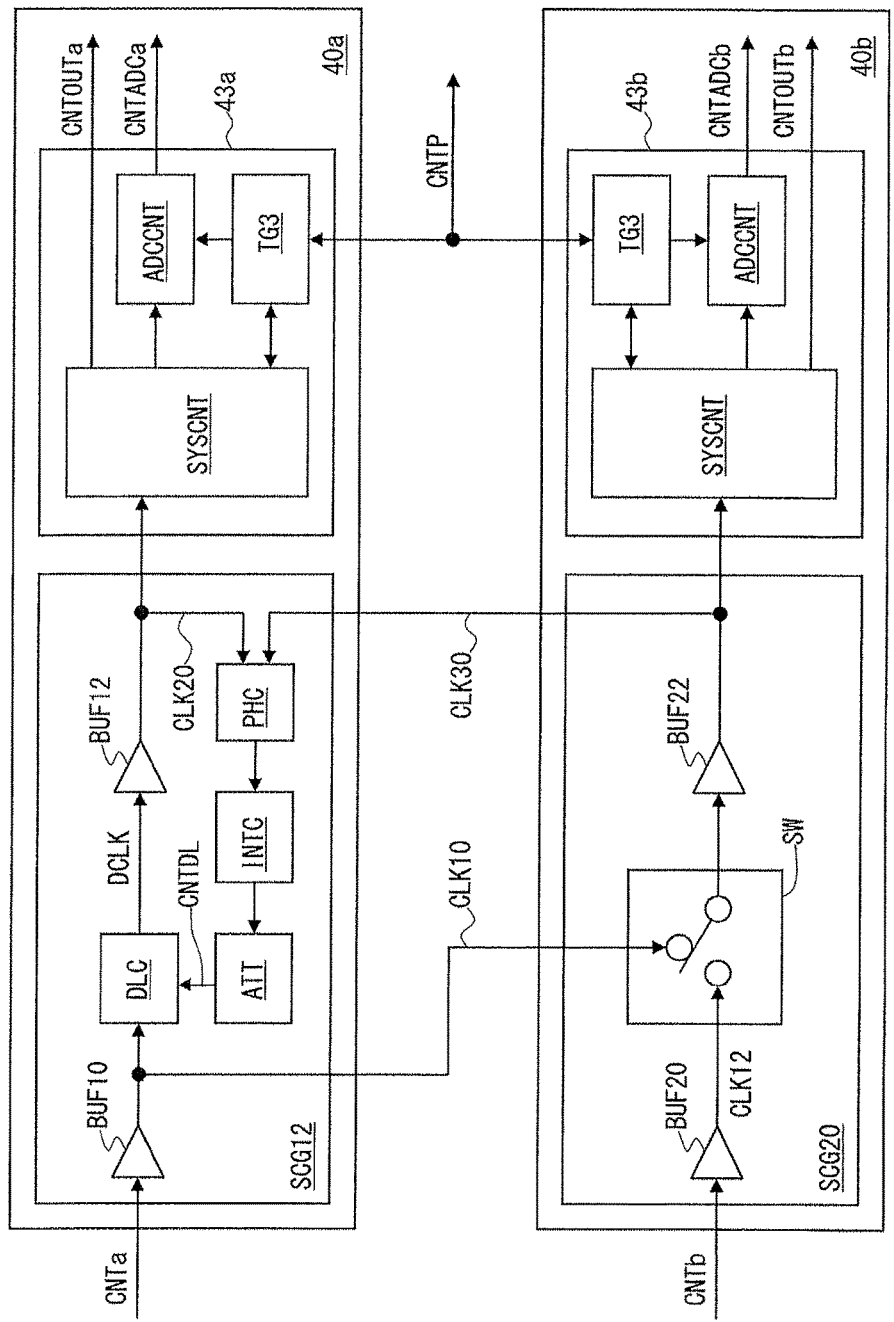
FIG. 7 is a diagram illustrating an example of a signal processing chip of an imaging device in another embodiment.

FIG. 7 shows an example of the signal processing chips 40a and 40b of the imaging device 10 in another embodiment. Components that are similar to those described in the above-mentioned embodiment are attached to the same reference numerals, with detailed description thereof being omitted. In the imaging device 10 of this embodiment, the configuration of the signal processing chip 40a is different from the embodiment described in FIG. 6. The rest of the configuration is identical to the embodiment described in FIG. 6. Note that in FIG. 7, description of the A/D conversion unit 44, the data bus circuit 46, the differential output circuit 48, and the bias circuit 50 or the like shown in FIG. 3 is omitted.

The signal processing chip 40a of this embodiment is provided with a synchronous clock generating unit SCG12, in place of the synchronous clock generating unit SCG10 shown in FIG. 6. Furthermore, in this embodiment, the clock terminal CLK 30 is added to the signal processing chip 40a shown in FIG. 6, and the clock terminal CLK 20 and the delay control terminal CNTDL are omitted from the signal processing chip 40a shown in FIG. 6. The rest of the configuration of the signal processing chip 40a of this embodiment is identical to that of the embodiment described in FIG. 6. The clock terminal CLK 30 of the signal processing chip 40a is coupled to the clock terminal CLK 30 of the signal processing chip 40b by, for example, a wiring pattern or the like formed on the glass plate 20 shown in FIG. 1, for example.

The synchronous dock generating unit SCG12 has the buffer unit BUF10, the delay circuit DLC, the buffer unit BUF12, a phase comparator PNC, an integration circuit INTC, and an attenuator ATT. That is, the synchronous dock generating unit SCG12, the phase comparator PHC, the integration circuit INTC, and the attenuator ATT are added to the synchronous clock generating unit SCG10. The operation of the buffer unit BUF10, the delay circuit DLC and the buffer unit BUF12 is identical to the operation of the buffer unit BUF10, the delay circuit DLC, and the buffer unit BUF12 of the synchronous clock generating unit SCG10 described in FIG. 6.

The phase comparator PHC receives the clock CLK 20 (the internal clock of the signal processing chip 40a) from the buffer unit BUF12, and also receives the clock CLK 30 (the internal clock of the signal processing chip 40b) from the signal processing chip 40b via the clock terminal CLK 30. Then, the phase comparator PHC detects the phase difference between the clock CLK 20 and the clock CLK 30 by comparing the phase of the clock CLK 20 and the phase of the clock CLK 30 with each other. For example, the phase comparator PHC outputs the detected phase difference to the integration circuit INTC.

The integration circuit INTC calculates the average of the phase difference between the clock CLK 20 and the clock CLK 30, by integrating the signals indicating the phase difference received from the phase comparator PHC. Then, the integration circuit INTC outputs, to the attenuator ATT, the signal indicating the average of the phase difference between the clock CLK 20 and the clock CLK 30.

The attenuator ATT generates the delay control signal CNTDL, based on the signal received from the integration circuit INTC (the signal indicating the average of the phase difference between the clock CLK 20 and the clock CLK 30). Then, the attenuator ATT outputs the generated delay control signal CNTDL to the delay circuit DLC. As thus described, the integration circuit INTC and the attenuator ATT function as a delay control unit which generates the delay control signal CNTDL based on the phase difference detected by the phase comparator PHC.

If, for example, the initial amount of delay of the delay circuit DLC has been set to "0", the attenuator ATT sets the amount of delay corresponding to half the average of the phase difference between the clock CLK 20 and the clock CLK 30, to the amount of delay indicated by the delay control signal CNTDL. Accordingly, the amount of delay of the delay circuit DLC is set to the amount of delay which is half the amount of delay of the clock CLK 10 having traveled back and forth between the signal processing chips 40a and 40b.

That is, the amount of delay of the delay circuit DLC which is set by the delay control signal CNTDL is adjusted to the amount of delay until the clock CLK 10 is transmitted from the signal processing chip 40a to the signal processing chip 40b (also referred to as the amount of delay between the signal processing chips 40a and 40b, in the following). Accordingly, the amount of delay of the clock CLK 20 relative to the clock CLK 10 which has been output from the buffer unit BUF10 becomes equal to the amount of delay of the clock CLK 30 relative to the clock CLK 10 which has been output from the buffer unit BUF10. As a result, in this embodiment, the operation timing of the signal processing chip 40a can be automatically matched with the operation timing of the signal processing chip 40b with high accuracy.

Note that, if, for example, the amount of delay is already set in the delay circuit DLC when the phase comparator PHC detects the phase difference, the amount of delay between the signal processing chips 40a and 40b is calculated by the following operation. For example, the amount of delay between the signal processing chips 40a and 40b is calculated by adding the amount of delay corresponding to half the average of the phase difference between the dock CLK 20 and the dock CLK 30, and the amount of delay half the amount of delay which is already set in the delay circuit DLC. This operation may be performed in the attenuator ATT, or may be performed in the delay circuit DLC.

Here, for example, the operation of the phase comparator PHC, the integration circuit INTC, and the attenuator ATT may be stopped after the amount of delay of the delay circuit DLC has been set to the amount of delay between the signal processing chips 40a and 40b. In this case, power consumption of the signal processing chip 40a can be reduced. Note that when, for example, the signal processing chip 40a operates independently, the delay circuit DLC operates with a predetermined amount of delay. Also in this case, the operation of the phase comparator PHC, the integration circuit INTC, and the attenuator ATT may be stopped.

Note that the configuration of the signal processing chips 40a and 40b is not limited to this example. For example, the synchronous clock generating units SCG12 and SCG20 may be respectively provided in the system controller SYSCNT of the signal processing chips 40a and 40b, or may be respectively provided in the timing generator TG3 of the signal processing chips 40a and 40b. Alternatively, the synchronous clock generating units SCG12 and SCG20 may be respectively provided in the A/D conversion control circuit ADCCNT of the signal processing chips 40a and 40b. In addition, the synchronous clock generating unit SCG12 may be provided in the signal processing chip 40b, and the synchronous clock generating unit SCG20 may be provided in the signal processing chip 40a. Furthermore, the synchronous clock generating units SCG12 and SCG20 may be respectively provided in the signal processing chips 40a and 40b shown in FIG. 5.

As has been described above, also in this embodiment, an effect similar to that of the embodiment described in FIGS. 1 to 4 can be obtained. Furthermore, in this embodiment, since the phase of the dock CLK 20 and the phase of the clock CLK 30 are adjusted so as to be equal to each other, the operation timing of the sensor chip 30 and the plurality of signal processing chips 40a and 40b can be matched with each other with high accuracy.

Figure 8:
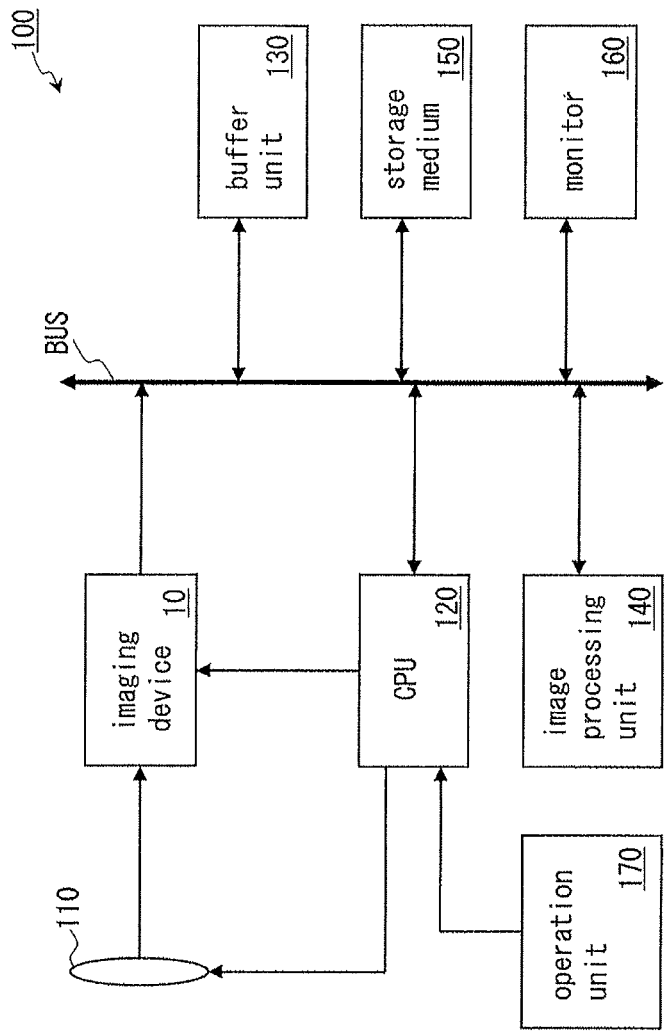
FIG. 8 is a diagram illustrating an overview of a digital camera using the imaging device of the embodiments described above.

FIG. 8 shows the outline of a digital camera 100 using the imaging device 10 of the embodiment described above. The digital camera 100 has, for example, the imaging device 10, an imaging lens 110, a CPU 120, a buffer unit 130, an image processing unit 140, a storage medium 150, a monitor 160, and an operation unit 170. The imaging device 10, the CPU 120, the buffer unit 130, the image processing unit 140, the storage medium 150, and the monitor 160 are coupled to, for example, a bus BUS.

The imaging lens 110 forms the image of the subject on the photoreceptor plane of the imaging device 10. The CPU 120, which is, for example, a microprocessor, controls the operation of the imaging device 10 and the operation of the imaging lens 110 or the like, based on a program which is not shown. The CPU 120 performs, for example, autofocus control, aperture control, exposure control for the imaging device 10, recording of image data, and the like.

The buffer unit 130, which is a built-in memory formed by, for example, a DRAM (Dynamic RAM), a SRAM (Static RAM), or the like, temporarily stores the image data or the like of the image captured by the imaging device 10. The image processing unit 140 performs image processing such as, for example, color interpolation processing, white balance processing, contour compensation processing, gamma processing, noise-reduction processing on the image data stored in the buffer unit 130.

The storage medium 150 stores image data of a captured image. The monitor 160, which is a liquid crystal display, for example, displays captured images, images stored in the storage medium 150, and a menu screen or the like. The operation unit 170 has a release button and other various switches, and is operated by the user n order to cause the digital camera 100 to operate.

In the embodiment described above, an example has been described in which the A/D converter ADC is provided for each column. The present invention is not limited to such an embodiment. For example, two A/D converters ADC may be provided in a single column. In this case, interleaving operation of the A/D converter ADC can be realized, whereby, for example, the time required for converting analog signals of the pixels PX in two rows into digital signals can be shortened. Alternatively, it is possible to lower the speed of conversion operation per A/D converter ADC. Also in this case, an effect similar to the embodiments described above can be obtained.

In the embodiment described above, an example has been described in which the signal processing chip 40a receives signals of the pixels PX in odd-numbered columns of the pixel array 32. The present invention is not limited to such an embodiment. For example, the signal processing chip 40a may receive signals of the pixels PX in even-numbered columns of the pixel array 32, In this case, for example, the signal processing chip 40b receives signals of the pixels PX in odd-numbered columns of the pixel array 32. Alternatively, when the pixels PX of the pixel array 32 are arranged as a Bayer array, for example, the signal processing chip 40a receives signals of the pixels PX corresponding to the green incident light, and the signal processing chip 40b may receive signals of the pixels PX corresponding to the red incident light and signals of the pixels PX corresponding to the blue incident light. In this case, for example, a switch or the like is provided in the amplifier array 36 which switches, for each row, the target of coupling of the input side of the column amplifier AP. Also in this case, an effect similar to the embodiment described above can be obtained.

In the embodiment described above, an example has been described in which a clock based on the clock in the control signal CNT is used as the synchronization clock. The present invention is not limited to such an embodiment. For example, in a configuration in which the signal processing chip 40 has an oscillator, the synchronization clock transferred by the synchronous control signal SYNS may be a clock based on the clock of the oscillator of the signal processing chip 40a. In this case, the control units 42a and 42b operate in synchronization with the clock based on the clock of the oscillator of the signal processing chip 40a. Similarly, the synchronization clock transferred by the A/D conversion control signal CNTADC2 shown in FIG. 5 may be a clock based on the clock of the oscillator of the signal processing chip 40a. In addition, the clock CLK 1 shown in FIGS. 6 and 7 may be a clock based on the clock of the oscillator of the signal processing chip 40a. Also in this case, an effect similar to the embodiment described above can be obtained.

In the embodiment described in the above-mentioned FIGS. 1 to 4, an example has been described in which setting of the master mode and the slave mode is performed for each control unit 42. The present invention is not limited to such an embodiment. For example, setting of the master mode and the slave mode may be performed by each of timing generator TG, system controller SYSCNT, or A/D conversion control circuit ADCCNT, of the control unit 42. Also in this case, an effect similar to the embodiment described in the above-mentioned FIGS. 1 to 4 can be obtained.

In the embodiment described in the above-mentioned FIGS. 1 to 4, an example has been described in which the timing generator TG of the control unit 42b set to the slave mode generates a timing control signal based on the driving control signal CNTP received from the timing generator TG of the control unit 42a. The present invention is not limited to such an embodiment. For example, the timing generator TG of the control unit 42b set to the slave mode may generate a timing control signal by a processing similar to the processing when it is set to the master mode. In this case, the control unit 42b set to the slave mode may not receive the driving control signal CNTP from the control unit 42a. Also in this case, the system controller SYSCNT of the control unit 42b and the A/D conversion control circuit ADCCNT of the control unit 42b operate in synchronization with the clock in the control signal CNTa. Therefore, also in this case, an effect similar to the embodiment described in the above-mentioned FIGS. 1 to 4 can be obtained.

In the embodiment described in the above-mentioned FIGS. 1 to 4, an example has been described in which the synchronous control signal SYNS is transferred between the timing generators TG of the signal processing chip 40a and 40b. The present invention is not limited to such an embodiment. For example, the synchronous control signal SYNS may be transferred between the system controllers SYSCNT of the signal processing chip 40a and 40b, or may be transferred between the A/D conversion control circuits ADCCNT of the signal processing chips 40a and 40b. Also in this case, an effect similar to the embodiment described in the above-mentioned FIGS. 1 to 4 can be obtained.

In the embodiment described in the above-mentioned FIG. 5, an example has been described in which the synchronization dock is transferred by the A/D conversion control signal CNTADC2. The present invention is not limited to such an embodiment. For example, the synchronization clock may be transferred between the simple timing generator STG and the timing generator TG2 by the synchronous control signal SYNS shown in FIG. 4, or may be transferred between the system controller SYSCNT2 and the system controller SYSCNT3. Also in this case, an effect similar to the embodiment described in the above-mentioned FIG. 5 can be obtained.

The many features and advantages of the embodiment are apparent from the detailed specification and, thus, it is intended by the appended claims to cover all such features and advantages of the embodiment that fall within the true spirit and scope thereof. Further, since numerous modifications and changes will readily occur to those skilled in the art, it is not desired to limit the inventive embodiment to exact construction and operation illustrated and described, and accordingly all suitable modifications and equivalents may be resorted to, falling within the scope thereof.

The invention claimed is:

1. An imaging device comprising:
a sensor chip in which a plurality of photoelectric converters which convert light into electric charge are arranged;
a first signal processing chip having a first circuit which is configured to convert a first signal generated by electric charge generated by conversion in a first photoelectric converter among the plurality of photoelectric converters into a digital signal and having a first controller which controls the first circuit; and
a second signal processing chip having a second circuit which is configured to convert a second signal generated by electric charge generated by conversion in a second photoelectric converter among the plurality of photoelectric converters into a digital signal and having a second controller which controls the second circuit, the second photoelectric converter being arranged on a side in a first direction of the first photoelectric converter, wherein:
the first signal processing chip and the second signal processing chip are arranged apart from each other in a second direction intersecting with the first direction; and
the first controller or the second controller has a timing generator which controls driving of the sensor chip.

2. The imaging device according to claim 1, wherein an area of the sensor chip is larger than an area of the first signal processing chip and an area of the second signal processing chip.

3. The imaging device according to claim 1, wherein:
the first signal processing chip has a first correcting circuit which corrects the first signal converted into a digital signal; and
the second signal processing chip has a second correcting circuit which corrects the second signal converted into a digital signal.

4. The imaging device according to claim 3, wherein:
the first correcting circuit includes a circuit which removes noise included in the first signal; and
the second correcting circuit includes a circuit which removes noise included in the second signal.

5. The imaging device according to claim 1, wherein in the sensor chip, a first signal line to which the first signal is output and a second signal line to which the second signal is output are arranged, the second signal line being different from the first signal line.

6. The imaging device according to claim 5, wherein:
the sensor chip has a first terminal which is coupled to the first signal line and a second terminal which is coupled to the second signal line; and
the first terminal and the second terminal are arranged apart from each other to sandwich a pixel array, in which the plurality of photoelectric converters are arranged, in the second direction.

7. The imaging device according to claim 1, wherein:
the sensor chip has a first amplifier which amplifies the first signal and a second amplifier which amplifies the second signal;
the first circuit is configured to convert the first signal amplified by the first amplifier into a digital signal; and
the second circuit is configured to convert the second signal amplified by the second amplifier into a digital signal.

8. The imaging device according to claim 7, wherein the first amplifier and the second amplifier are arranged apart from each other to sandwich a pixel array, in which the plurality of photoelectric converters are arranged, in the second direction.

9. The imaging device according to claim 1, comprising a plate on which light is incident, wherein the first photoelectric converter and the second photoelectric converter convert light from the plate into electric charge.

10. The imaging device according to claim 9, wherein:
the plate has a first wiring and a second wiring;
the first signal output via the first wiring is input to the first signal processing chip; and
the second signal output via the second wiring is input to the second signal processing chip.

11. The imaging device according to claim 1, wherein the first controller controls the first circuit in synchronization with the second controller.

12. The imaging device according to claim 1, wherein the first controller controls the first circuit and the second circuit.

13. The imaging device according to claim 12, wherein the first controller has a timing generator which controls driving of the sensor chip.

14. The imaging device according to claim 1, comprising:
a first output outputting the first signal converted into a digital signal using the first circuit; and
a second output outputting the second signal converted into a digital signal using the second circuit, wherein the first output and the second output are arranged apart from each other to sandwich a pixel array, in which the plurality of photoelectric converters are arranged, in the second direction.

15. The imaging device according to claim 1, wherein the first signal processing chip and the second signal processing chip are arranged apart from each other to sandwich the sensor chip.

16. The imaging device according to claim 1, wherein the first signal processing chip and the second signal processing chip are arranged apart from each other on an outside of a pixel array in which the plurality of photoelectric converters are arranged.

17. A camera comprising:
a sensor chip in which a plurality of photoelectric converters which convert light into electric charge are arranged;
a first signal processing chip having a first circuit which is configured to convert a first signal generated by electric charge generated by conversion in a first photoelectric converter among the plurality of photoelectric converters into a digital signal and having a first controller which controls the first circuit;

a second signal processing chip having a second circuit which is configured to convert a second signal generated by electric charge generated by conversion in a second photoelectric converter among the plurality of photoelectric converters into a digital signal and having a second controller which control the second circuit, the second photoelectric converter being arranged on a side in a first direction of the first photoelectric converter; and a recording controller configured to record the first signal converted into a digital signal using the first circuit and the second signal converted into a digital signal using the second circuit, wherein:

the first signal processing chip and the second signal processing chip are arranged apart from each other in a second direction intersecting with the first direction; and the first controller or the second controller has a timing generator which controls driving of the sensor chip.

18. The camera according to claim 17, wherein
the first signal processing chip and the second signal processing chip are arranged apart from each other to sandwich the sensor chip.

19. The camera according to claim 17, wherein
the first signal processing chip and the second signal processing chip are arranged apart from each other on an outside of a pixel array in which the plurality of photoelectric converters are arranged.

20. A camera comprising:
a sensor chip in which a plurality of photoelectric converters which convert light into electric charge are arranged;

a first signal processing chip having a first circuit which is configured to convert a first signal generated by electric charge generated by conversion in a first photoelectric converter among the plurality of photoelectric converters into a digital signal and having a first controller which controls the first circuit;

a second signal processing chip having a second circuit which is configured to convert a second signal generated by electric charge generated by conversion in a second photoelectric converter among the plurality of photoelectric converters into a digital signal and having a second controller which controls the second circuit, the second photoelectric converter being arranged on a side in a first direction of the first photoelectric converter; and a display controller configured to display an image generated by the first signal converted into a digital signal using the first circuit and the second signal converted into a digital signal using the second circuit, wherein:

the first signal processing chip and the second signal processing chip are arranged apart from each other in a second direction intersecting with the first direction; and the first controller or the second controller has a timing generator which controls driving of the sensor chip.

21. The camera according to claim 20, wherein
the first signal processing chip and the second signal processing chip are arranged apart from each other to sandwich the sensor chip.

22. The camera according to claim 20, wherein
the first signal processing chip and the second signal processing chip are arranged apart from each other on an outside of a pixel array in which the plurality of photoelectric converters are arranged.

* * * * *